(12) United States Patent
Schustereder et al.

(10) Patent No.: US 11,557,506 B2
(45) Date of Patent: Jan. 17, 2023

(54) METHODS FOR PROCESSING A SEMICONDUCTOR SUBSTRATE

(71) Applicant: Infineon Technologies AG, Neubiberg (DE)

(72) Inventors: Werner Schustereder, Villach (AT); Alexander Breymesser, Villach (AT); Mihai Draghici, Villach (AT); Tobias Franz Wolfgang Hoechbauer, Villach (AT); Wolfgang Lehnert, Lintach (DE); Hans-Joachim Schulze, Taufkirchen (DE); Marko David Swoboda, Dresden (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 17/104,559

(22) Filed: Nov. 25, 2020

(65) Prior Publication Data

US 2021/0159115 A1 May 27, 2021

(30) Foreign Application Priority Data

Nov. 27, 2019 (DE) .......................... 102019132158.1

(51) Int. Cl.
*H01L 21/00* (2006.01)
*H01L 21/762* (2006.01)
(Continued)

(52) U.S. Cl.
CPC ...... *H01L 21/76254* (2013.01); *H01L 21/265* (2013.01); *H01L 21/31155* (2013.01); *H01L 21/76825* (2013.01); *H01L 21/7806* (2013.01)

(58) Field of Classification Search
CPC ......... H01L 21/76251; H01L 21/76254; H01L 21/7806
See application file for complete search history.

(56) References Cited

U.S. PATENT DOCUMENTS

| | | | |
|---|---|---|---|
| 2003/0008477 A1* | 1/2003 | Kang | H01L 21/3065 438/458 |
| 2003/0077885 A1 | 4/2003 | Aspar et al. | |

(Continued)

FOREIGN PATENT DOCUMENTS

| | | |
|---|---|---|
| DE | 102013016665 A1 | 4/2015 |
| DE | 102016100565 A1 | 7/2017 |
| DE | 112016003716 T5 | 5/2018 |

OTHER PUBLICATIONS

Colby et al., "Amorphous interface layer in thin graphite films grown on the carbon face of SiC", Birck and NCN Publications, Paper 956; 2011.

(Continued)

*Primary Examiner* — Reema Patel
(74) *Attorney, Agent, or Firm* — Cooper Legal Group LLC

(57) ABSTRACT

Methods for processing a semiconductor substrate are proposed. An example of a method includes forming cavities in the semiconductor substrate by implanting ions through a first surface of the semiconductor substrate. The cavities define a separation layer in the semiconductor substrate. A semiconductor layer is formed on the first surface of the semiconductor substrate. Semiconductor device elements are formed in the semiconductor layer. The semiconductor substrate is separated along the separation layer into a first substrate part including the semiconductor layer and a second substrate part.

19 Claims, 5 Drawing Sheets

(51) Int. Cl.
    *H01L 21/768* (2006.01)
    *H01L 21/265* (2006.01)
    *H01L 21/3115* (2006.01)
    *H01L 21/78* (2006.01)

(56) References Cited

U.S. PATENT DOCUMENTS

| | | |
|---|---|---|
| 2005/0048738 A1 | 3/2005 | Shaheen |
| 2007/0117350 A1* | 5/2007 | Seacrist ............ H01L 21/30604 438/459 |
| 2017/0372965 A1* | 12/2017 | Nishibayashi .... H01L 21/02527 |
| 2018/0158720 A1* | 6/2018 | Hu .................... H01L 21/76254 |

OTHER PUBLICATIONS

Claverie et al., "Thermal evolution of H-related defects in H implanted Si: from nano-platelets to micro-cracks", IIT 2018 Proceedings, 2018 22nd International Conference on Ion Implantation Technology, Sep. 16-21, 2018.

Grisolia et al., "Kinetic aspects of the growth of hydrogen induced platelets in SiC", J. Appl. Phys., vol. 87(12), 2000, pp. 8415-8419.

\* cited by examiner

METHODS FOR PROCESSING A SEMICONDUCTOR SUBSTRATE

RELATED APPLICATION

This application claims priority to German Patent Application No. 102019132158.1, filed on Nov. 27, 2019, entitled "METHODS FOR PROCESSING A SEMICONDUCTOR SUBSTRATE", which is incorporated by reference herein in its entirety.

TECHNICAL FIELD

The present disclosure is related to methods for processing a semiconductor substrate, for example to methods where the semiconductor substrate is separated into a first substrate part and a second substrate part.

BACKGROUND

Methods for processing a semiconductor substrate, e.g. when forming semiconductor devices in the semiconductor substrate, may include grinding a semiconductor wafer, e.g. to reduce an electrical resistance of the semiconductor device. Grinding can be time consuming and may include high consumption of semiconductor material, resulting in high costs for semiconductor devices. For example, no re-use concepts for forming further semiconductor devices using the semiconductor substrate are possible in this case.

Semiconductor substrates, e.g. silicon carbide wafers or silicon wafers, may be split so that reuse concepts can be enabled. However, splitting the semiconductor substrate may limit some semiconductor processes required for forming a semiconductor device or may result in imprecise thickness of the split semiconductor substrate part. For example, a required thickness of a split semiconductor substrate part might not be achievable by using some splitting concepts. There may be a desire for improved concepts for processing semiconductor substrates.

SUMMARY

An example of the present disclosure relates to a method for processing a semiconductor substrate. The method comprises forming cavities in the semiconductor substrate by implanting ions through a first surface of the semiconductor substrate, wherein the cavities define a separation layer in the semiconductor substrate. The method further comprises, after forming the cavities, forming a semiconductor layer on the first surface of the semiconductor substrate. The method further comprises forming semiconductor device elements in the semiconductor layer. The method further comprises, after forming the semiconductor device elements in the semiconductor layer, separating the semiconductor substrate along the separation layer into a first substrate part comprising the semiconductor layer and a second substrate part.

Another example of the present disclosure relates to a method for processing a semiconductor substrate. The method comprises implanting ions through a first surface of the semiconductor substrate to define a separation layer in the semiconductor substrate. The method further comprises separating the semiconductor substrate along the separation layer into a first substrate part and a second substrate part, wherein separating the semiconductor substrate along the separation layer comprises irradiating the semiconductor substrate with electromagnetic radiation of a first wavelength and with electromagnetic radiation of a second wavelength different from the first wavelength.

Another example of the present disclosure relates to a method for processing a semiconductor substrate. The method comprises forming cavities in the semiconductor substrate by implanting ions through a first surface of the semiconductor substrate, wherein the cavities define a separation layer in the semiconductor substrate. The method further comprises forming a semiconductor layer on the first surface of the semiconductor substrate. The method further comprises forming semiconductor device elements in the semiconductor layer. The method further comprises separating the semiconductor substrate along the separation layer into a first substrate part comprising the semiconductor layer and a second substrate part.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate examples of methods of processing semiconductor substrates and together with the description serve to explain principles of the examples. Further examples are described in the following detailed description and the claims.

DETAILED DESCRIPTION

Figure 1A:
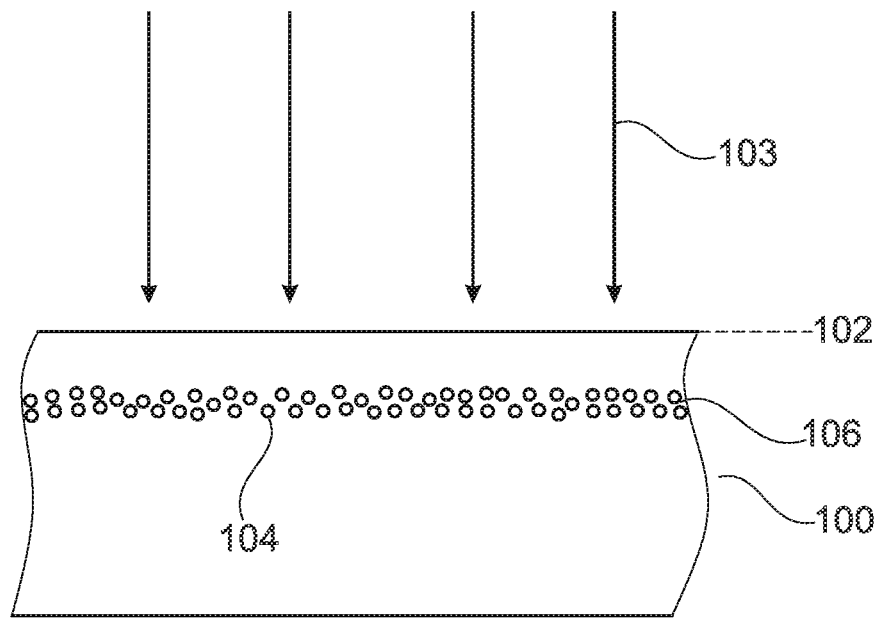
FIGS. 1A to 1D are schematic cross-sectional view for illustrating a method of processing a semiconductor substrate.

In the following detailed description, reference is made to the accompanying drawings, which form a part hereof and in which are shown by way of illustrations specific examples in which semiconductor substrates may be processed. It is to be understood that other examples may be utilized and structural or logical changes may be made without departing from the scope of the present disclosure. For example, features illustrated or described for one example can be used on or in conjunction with other examples to yield yet a further example. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening elements adapted for signal and/or power transmission may be connected between the electrically coupled elements, for example, elements that are controllable to temporarily provide a low-resistive connection in a first state and a high-resistive electric decoupling in a second state.

An ohmic contact is a non-rectifying electrical junction with a linear or almost linear current-voltage characteristic. A Schottky contact is a metal-semiconductor junction with rectifying characteristics, wherein the work function of the metal and the dopant concentration in the semiconductor material are selected such that in the absence of an externally applied electric field a depletion zone forms in the semiconductor material along the metal-semiconductor junction. In the context of a Schottky contact, the term "metal-semiconductor junction" may also refer to a junction between a metal-like semiconductor and a semiconductor, wherein the junction has the same characteristics as a metal-semiconductor junction. For example, it may be possible to form a Schottky contact between polycrystalline silicon and silicon carbide. If two components (e.g., two regions) form an ohmic contact or a Schottky contact, respectively, this may mean that an ohmic contact or a Schottky contact is present between said two components. In both cases, it may be possible for said two regions to directly adjoin each other. However, it may also be possible that a further component is positioned between said two components.

Ranges given for physical dimensions include the boundary values. For example, a range for a parameter y from a to b reads as $a \leq y \leq b$. The same holds for ranges with one boundary value like "at most" and "at least".

Main constituents of a layer or a structure from a chemical compound or alloy are such elements which atoms form the chemical compound or alloy. For example, silicon (Si) and carbon (C) are the main constituents of a silicon carbide (SiC) layer.

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

An example of a method for processing a semiconductor substrate may comprise forming cavities in the semiconductor substrate by implanting ions through a first surface of the semiconductor substrate. The cavities define a separation layer in the semiconductor substrate. A semiconductor layer may be formed on the first surface of the semiconductor substrate. For example, the semiconductor layer may be formed on the first surface of the semiconductor substrate after forming the cavities. Semiconductor device elements may be formed in the semiconductor layer. The semiconductor substrate may be separated along the separation layer into a first substrate part including the semiconductor layer and a second substrate part. For example, the semiconductor substrate may be separated along the separation layer after the semiconductor device elements are formed in the semiconductor layer.

The semiconductor substrate may include or consist of a semiconductor material from the group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (Site). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe).

For example, the semiconductor substrate may be a crystalline SiC semiconductor substrate. For example, the silicon carbide crystal may have a hexagonal polytype, e.g., 4H or 6H. The silicon carbide semiconductor body may be homogeneously doped or may include differently doped SiC layer portions. The silicon carbide semiconductor body may include one or more layers from another material with a melting point close to or higher than crystalline silicon carbide. For example, the layers from another material may be embedded in the crystalline silicon carbide substrate. The silicon carbide semiconductor substrate may have two essentially parallel main surfaces of the same shape and size and a lateral surface area connecting the edges of the two main surfaces. For example, the silicon carbide semiconductor body may be a rectangular prism with or without rounded edges or a right cylinder or a slightly oblique cylinder (e.g., where the sides lean with an angle of at most 8° or at most 5° or at most 3°) with or without one or more flats and/or notches along the outer circumference.

The cavities may be caused by an agglomeration of vacancies, wherein the vacancies may be formed by the interaction of the implanted ions and the lattice of the semiconductor substrate. The cavities may define the separation layer at an end-of-range of the implanted ions, e.g. a peak at the penetration depth of the implanted ions.

The semiconductor layer may be formed by at least one layer deposition process, e.g. an epitaxial layer deposition process. For example, chemical vapor deposition (CVD) techniques may be used for forming the semiconductor layer. A doping concentration profile and/or thickness of the semiconductor layer may be chosen in consideration of target device parameters, e.g. voltage blocking capability and/or area-specific on-state resistance. For example, a first part of the semiconductor layer may be a drift zone. A second part of the semiconductor layer may be a field stop zone. The field stop zone may be arranged between the drift zone and a rear side contact. For example, a doping concentration in the field stop zone may be larger, e.g. one or two orders of magnitude larger, than a doping concentration in the drift zone.

Forming the semiconductor device elements in the semiconductor layer may include one or more features of forming semiconducting regions, e.g. p- and/or n-doped regions, insulating layers, e.g. gate and/or field dielectric(s) and/or interlayer dielectric(s), conducting layers, e.g. metal layer(s) for electric contacts and/or wirings, protection and/or passivation layer(s), e.g. imide. The semiconductor regions, e.g. a drain region, a source region, a body region, a body contact region, a current spread region, a shielding region, an anode region, and/or a cathode region, may be formed by ion implantation and/or diffusion from a diffusion source, for example. A planar gate structure including a gate dielectric and a gate electrode or a trench gate structure including a gate dielectric and a gate electrode in a trench may be formed by thermal oxidation and/or layer deposition of the gate dielectric and layer deposition of a highly doped semiconductor, for example polycrystalline silicon and/or metal layer(s).

For example, at least part of the semiconductor device elements may be active device elements formed in an active device area of the semiconductor substrate. The active device area is an area of the semiconductor substrate where a load current flow enters and/or exits the semiconductor substrate and/or the semiconductor layer through a surface. In case of IGFETs (insulated gate field effect transistors) or IGBTs (insulated gate bipolar transistors), the active device area may include source regions electrically connected to a contact electrode through the surface. A source to drain current or emitter to collector current may flow from the contact electrode through the surface into the source regions. In case of diodes, the active device area may include anode or cathode regions electrically connected to the contact electrode through the surface. An anode to cathode current may flow from the contact electrode through the surface into the anode or cathode regions. Thus, the active device area may be restricted to a first part of the surface through which load current flow is guided, for example. For example, edge termination elements may, in addition to the active device elements, be formed in an edge termination area, which is an area of the semiconductor substrate that partly or fully surrounds the active device area. Since pn junctions within the semiconductor substrate, e.g. pn junctions between a body region and a drift zone of an IGFET or an IGBT or pn junctions between a cathode and an anode region of a diode, are not infinite, but terminate at the edge zones of the semiconductor body, this edge effect limits the device breakdown voltage below the ideal value that is set by the infinite parallel plane junction. Care must be taken to ensure proper and efficient termination of the pn junction at the edge of the semiconductor substrate. The edge termination area is a measure for ensuring proper and efficient termination of the pn junction. Examples of edge termination structures in the edge termination area include field plates, junction termination extension (JTE) structures, variation of lateral doping (VLD) structures, for example. Other than the active device area, the edge termination area may be restricted to a second part of the surface i) that fully or partly surrounds the first part of the active device area, and ii) through which no load current flow (and/or less than a threshold amount of load current flow) is guided through the surface to the contact electrode, and iii) that contributes to termination of the pn junction. There may be a transition region between the active device area and the edge termination area for electrically connecting the edge termination structure, for example.

For example, the semiconductor device elements may define a vertical power semiconductor device. The vertical power semiconductor device may be a power semiconductor diode, or a power semiconductor IGBT, or a power semiconductor transistor such as a power semiconductor IGFET (e.g., MOSFET (metal oxide semiconductor field effect transistor)). The vertical power semiconductor device may be configured to conduct currents of more than 1 ampere (A) and may be further configured to block voltages between load terminals, e.g. between drain and source of a MOSFET, or between emitter and collector of an IGBT, or between cathode and anode of a diode, in the range of several hundreds of up to several thousands of volts, e.g. 650 volts (V), 1.2 kilovolts (kV), 1.7 kV, 3.3 kV, 4.5 kV, 5.5 kV, 6 kV, 6.5 kV. The blocking voltage may correspond to a voltage class specified in a datasheet of the power semiconductor device, for example.

Dose(s) of the implanted ions may be chosen in an appropriate range so that processing of the semiconductor substrate before the separation is possible without undesired, early separation by thermomechanical stress impacting on the semiconductor substrate. Thermomechanical stress may impact on the semiconductor substrate when forming the semiconductor device elements therein, for example. For example, the ions may include helium ions, and an implantation dose of the helium ions may range from $5\times10^{14}$ centimeters $(cm)^{-2}$ to $5\times10^{15}$ $cm^{-2}$. In addition or as an alternative, the ions may include protons, and an implantation dose of the protons ranges from $5\times10^{15}$ $cm^{-2}$ to $5\times10^{16}$ $cm^{-2}$, for example.

Separation of the semiconductor substrate into the first substrate part including the semiconductor layer and the second substrate part may be achieved by at least irradiating the semiconductor substrate with light, e.g. laser light, of a target wavelength. For example, the separation of the semiconductor substrate may be carried out solely by irradiating the silicon carbide wafer or additional processes (e.g., heating, applying mechanical stress and/or force and/or ultrasonic treatment) may be performed to separate the semiconductor substrate into the first substrate part and the second substrate part.

For separating the semiconductor substrate, e.g. an energy of the light of the target wavelength, may be selected based on an energy necessary to split the semiconductor substrate, based on the absorption coefficient of the separation layer, based on a thickness of the semiconductor substrate, based on a thickness of the separation layer and/or based on a position of the separation layer within the semiconductor substrate (e.g., to account for additional absorption by the semiconductor substrate). The light of the target wavelength may be irradiated onto the front side and/or onto a back side of the semiconductor substrate. Due to the higher absorption coefficient of the separation layer, a larger portion of the light of the target wavelength may be absorbed within the separation layer than in the material of the semiconductor substrate outside the separation layer. For example, the light of the target wavelength absorbed within the separation layer may cause decomposition or destruction of at least a part, e.g. a laterally connected area, of the separation layer so that the semiconductor substrate may be separated along the separation layer. Released energy of the light of the target wavelength absorbed within the separation layer may cause splitting of the semiconductor substrate.

For example, both the first semiconductor substrate part and the second substrate part may comprise the material of the semiconductor substrate outside the separation layer as a main material or may consist of said material. Splitting the semiconductor substrate along the separation layer may enable defining a thickness of the first substrate part more exactly and/or with reduced variation along a lateral extension of the first substrate part and/or more homogenously along a lateral extension of the first substrate part, e.g. compared to other separation methods. For example, the method may improve the control over the thickness of the first semiconductor substrate part. A thickness of the separation layer may be smaller compared to a thickness of other splitting regions so that a variation of the thickness of the first semiconductor substrate part may be reduced. Also, a consumption of material of the semiconductor substrate for splitting may be reduced by providing the separation layer with reduced thickness.

Examples relate to aspects which may enable forming the separation layer with an absorption coefficient higher than 5 times, or even higher than 100 times, compared to the absorption coefficient of the semiconductor material of the semiconductor substrate outside the separation layer.

Some methods may be based on the irradiation using a focused laser. The laser may have a peak wavelength within the absorption gap of semiconductor substrate, for example. In the focal point, by high photon density (e.g., photon density higher than a threshold photon density) a charge carrier plasma may be generated which in turn may increase absorption, for example. Consequently, a positive feedback mechanism may result which e.g. allows to locally decompose the semiconductor material of the semiconductor substrate and thus to generate a splitting layer which may be used (e.g., used after generating the splitting layer) for the separation process with supporting thermo-mechanical stress. For example, the separation process may be executed when processing the devices is more or less completed. For example, the semiconductor substrate may already be metallized at the front side when the separation process is executed.

In addition or as an alternative to irradiating the semiconductor substrate with light of a target wavelength for separating the semiconductor substrate, the separation process may further comprise at least one of the following processes (i)-(iii): (i) heating the semiconductor substrate, (ii) applying mechanical stress and/or force to the semiconductor substrate, or (iii) ultrasonic treatment of the semiconductor substrate. For example, the at least one additional process (i)-(iii) may be applied during and/or after irradiating the silicon carbide wafer with the light of the target wavelength. At least one of the processes (i)-(iii) may be applied for separating the semiconductor substrate. For example, heating or annealing the semiconductor substrate (process (i)) may facilitate separating the semiconductor substrate, e.g. by introducing thermomechanical stress at the separation layer to support splitting the semiconductor substrate. Mechanical force and/or stress (process (ii)) may be applied, for example, by forming an additional layer on the silicon carbide wafer, which additional layer may be mechanically pre-stressed (e.g., twisted and/or tensioned) with respect to the semiconductor substrate. For example, the additional layer may be a polyimide layer. In addition or as an alternative, applying mechanical force and/or stress in the process (ii) may involve applying compressed gas or compressed air to a side face of the semiconductor substrate. Ultrasonic treatment (process (iii)) may comprise applying ultrasonic radiation to the semiconductor substrate. Ultrasonic treatment may also result in heating the semiconductor substrate, analogue to process (i).

For example, the method may further include implanting protons through the semiconductor layer into the semiconductor substrate. For example, the protons may be implanted after forming the semiconductor layer. The protons may be implanted after ion implantation of dopants and after thermal activation of the dopants for forming the semiconductor device elements in the semiconductor layer. The protons may be implanted before gate oxide formation, for example. An end-of-range of the implanted protons may at least partly overlap an end-of-range of the ions implanted for forming the cavities, for example. The implanted protons may contribute to complex formation, e.g. $SiH_2$. This may support mechanical stress required for the separation of the semiconductor substrate that may be further enlarged by any of the processes described further above or below.

For example, the ions further may include ions comprising carbon. An end-of-range of the implanted carbon may at least partly overlap an end-of-range of the implanted ions for forming the cavities. Carbon implantation may lead to a carbon-rich interface of the cavities. This may allow for increasing absorption of light by the separation layer, and therefore may allow for improving the separation process, for example. For example, a temperature of the semiconductor substrate during implantation of the ions may be set in a range from 20° C. to 700° C. or in a range between 25° C. and 550° C. Minimizing the self-annealing effect may allow for improving absorption behavior of the separation layer and/or allow for low ion implantation doses. Minimizing the self-annealing effect may be achieved by using low semiconductor substrate temperatures during ion implantation, e.g. semiconductor substrate temperatures in a range from 20° C. to 150° C., or from 20° C. to 250° C.

For example, the cavities may be formed in a porous part of the semiconductor substrate. The porous part may be formed within the semiconductor substrate or on a surface of the semiconductor substrate, for example. Forming the porous part may enable increasing the absorption coefficient of the separation layer and/or to provide the surface of the semiconductor substrate with a defect density at or below a critical limit that may allow growing a high quality epitaxial layer (e.g., an epitaxial layer having a quality higher than a threshold quality) on the surface, e.g. after forming the porous part.

The porous part may be formed in the semiconductor substrate, for example, by anodization, e.g. in an electrolyte comprising fluorine. The electrolyte may comprise hydrofluoric acid (HF) and/or ethanol. Anodization electrochemically decomposes, to a certain extent, the semiconductor substrate crystal in the region of the porous part. Instead of uniformly decomposing the semiconductor substrate crystal, electrochemical decomposition may locally remove atoms out of the semiconductor substrate crystal lattice, forming small holes or pores within the semiconductor substrate. For example, the crystal structure of the semiconductor substrate outside the porous part may remain unaffected by the anodization.

A porosity of the porous part may be measured as a ratio of the effective pore volume (e.g. volume of the pores) in the porous part to the total volume of the porous part (including the semiconductor substrate volume and pore volume within the porous part). For example, a higher porosity value may indicate a higher density of pores or a higher pore volume in the porous part, whereas a lower porosity value may indicate a lower density of pores or a lower pore volume in the porous part. For example, the porous part may have a porosity between 5% and 95% (or between 10% and 80%, or between 25% and 60%), for example. For example, porous part may have a density (weight per volume) of about 90%, 80% or 70% of the semiconductor substrate material surrounding the porous part.

For example, the ions may be implanted through at least a part (e.g. a vertical portion) of the porous part. For example, the porous part may be formed before implanting ions to form the separation layer. The separation layer may be formed within the porous part (e.g. the separation layer may be formed completely within the porous part) and ions may be implanted through a first vertical portion of the porous part. For example, at least a first vertical portion of the separation layer may be formed below the porous part, e.g. the porous part may be positioned vertically between the surface of the semiconductor substrate the ions are implanted through, and the first vertical portion of the separation layer.

Implanting the ions for forming the separation layer through at least part of the porous part may increase the depth of the implantation (e.g. increased distance between the surface of the semiconductor substrate and the separation layer), whereas the surface damage may be kept close to its intrinsic value for the implantation dose applied, for example. Consequently, the distance between the separation layer and e.g. an electrically active device layer of the semiconductor substrate (e.g. formed after forming the separation layer and before separating the semiconductor substrate) may be increased and e.g. less interaction during separation (e.g. by irradiation with light, e.g. laser light) with the active semiconductor device elements may occur.

As mentioned, the separation layer or at least a vertical portion of the separation layer may be formed within the porous part. Forming the separation layer into a porous part of the semiconductor substrate may increase the absorption capability of this layer (e.g. may result in a higher absorption coefficient), e.g. enabling a combination of mechanical and electrical and/or optical active light absorption centers. For example, splitting (e.g. by light irradiation, e.g. laser light irradiation) may be enabled with a lower implantation dose (e.g. a combined implantation dose to form the absorption layer), resulting in lower surface damage and consequently a surface quality appropriate for epitaxial growth.

Ion implantation into the semiconductor substrate prior to a porosification process may enable adapting the porosification intensity (e.g. porosity) and/or depth profile of the porous part. This may increase the absorption coefficient (e.g. higher absorption of irradiated light) in the separation layer and/or may result in a better surface quality for epitaxial growth at a sufficiently high absorption coefficient (e.g., an absorption coefficient higher than a threshold absorption coefficient) in the separation layer and/or may have a beneficial effect of the development of the porous part (e.g. a porous silicon carbide layer) due to thermal budget of further processing of the semiconductor substrate (e.g. epitaxial growth, activation anneal, etc.).

For example, a surface layer (e.g. thin surface layer) of the porous part may be transformed or converted into a non-porous layer (e.g. so-called skin layer or start layer). In some examples, the surface layer of the porous part may be transformed or converted into the non-porous layer before forming the semiconductor layer on the porous part of the semiconductor substrate. In addition or as an alternative, the porosification may be performed such that a non-porous part remains at the surface. The quality of an epitaxial layer grown on a non-porous semiconductor layer may be higher than a quality of an epitaxial layer grown on a porous semiconductor layer, for example.

For example, the porous part may be formed with at least two porous layers, e.g. vertically adjacent to each other, with different porosities. The porosity of the upper layer (e.g., providing the surface of the semiconductor substrate) may be chosen in a way allowing a suitable skin layer to be formed on the surface, e.g. prior to growing an epitaxial layer on the surface of the semiconductor substrate. For example, a surface layer of the porous part may be transformed into a non-porous layer. In some examples, the surface layer of the porous part may be transformed into the non-porous layer after forming the separation layer. For example, the surface layer transformed into the non-porous layer may be the skin layer and may be used as start layer for growing an epitaxial layer, for example.

For transforming the surface layer of the porous part into a non-porous crystalline start layer, the surface layer of the porous part may be heated, e.g. in a reducing atmosphere comprising hydrogen. The heat treatment may result in a rearrangement of the atoms in a thin layer along the exposed surface of the semiconductor substrate, wherein the atoms in the thin surface layer of the porous part may re-order in a reflow process to form a continuous non-porous crystalline start layer, for example having a high crystal quality (e.g., a crystal quality higher than a threshold crystal quality). Alternatively or additionally, the non-porous crystalline start layer may be formed by epitaxial growth on the porous part or by laser annealing causing rearrangement of the atoms on the surface of the porous silicon carbide layer.

The non-porous crystalline start layer may be used as a base for growing an epitaxial layer, e.g. the semiconductor layer. As the non-porous crystalline start layer may have a high crystal quality, the epitaxial layer may grow with high crystal quality on the non-porous crystalline start layer (e.g., the epitaxial layer may have a quality higher than a threshold quality). For example, the epitaxial layer grown on the non-porous crystalline start layer may have a crystal defect density comparable to epitaxial layers grown directly on conventional non-porous single crystal semiconductor substrates (e.g., a difference between the crystal defect density of the epitaxial layer and a crystal defect density of epitaxial layers grown directly on conventional non-porous single crystal semiconductor substrates may be less than a threshold difference).

For example, the porous part may have a thickness of at least 0.3 micrometers (μm) (or of at least 0.5 μm, of at least 0.8 μm, or of at least 1.2 μm) and/or of at most 3 μm (or of at most 2 μm, or of at most 1.5 μm).

For example, the porous part may limit penetration of critical defects from the semiconductor substrate (e.g. between a back side surface of the semiconductor substrate and the porous part) into a drift zone of a device (e.g. formed after forming the separation layer and/or before separating the semiconductor substrate) so that the defect density and/or detrimental bipolar degradation effects in the drift zone may be at least reduced.

For example, the porous part may be arranged between non-porous, single crystalline parts of the semiconductor substrate.

For example, the semiconductor substrate may be processed by forming a second semiconductor layer on a first portion of the semiconductor substrate, wherein the second semiconductor layer is a second portion of the semiconductor substrate exposed at the first surface of the semiconductor substrate, and wherein a thickness of the second portion of the semiconductor substrate ranges from 5 μm to 60 μm. In some examples, the second semiconductor layer may be formed on the first portion of the semiconductor substrate before forming the cavities in the semiconductor substrate.

For example, separating the semiconductor substrate along the separation layer may comprise concurrently irradiating the semiconductor substrate with superposed electromagnetic radiation from at least two radiation sources, the superposed electromagnetic radiation having intensity peaks at two or more wavelengths. Using at least two radiation sources for irradiating the semiconductor substrate with electromagnetic radiation at two different wavelengths may allow for an improved separation process. For example, a first radiation of the first radiation source having a first wavelength may be absorbed within the separation layer and may lead to electron-hole generation in the separation layer. A second radiation of the second radiation source may provide further energy to the electrons and holes in the separation layer. This additional local application of energy by the second radiation source may be at least partly transferred to the lattice in or around the separation layer.

This may lead to a local heating of the semiconductor substrate, and thus to an improved disturbance of the lattice in or around the separation layer which may improve the separation process of the semiconductor substrate.

Process details described with respect to the examples above likewise apply to the examples described below, and vice versa.

An example of a method for processing a semiconductor substrate may comprise implanting ions through a first surface of the semiconductor substrate to define a separation layer in the semiconductor substrate. The method may further comprise separating the semiconductor substrate along the separation layer into a first substrate part and a second substrate part at least by irradiating the semiconductor substrate with electromagnetic radiation of a first wavelength and with electromagnetic radiation of a second wavelength different from the first wavelength. Similar to the example described above, the separation process may be improved by a local heating of free carriers, e.g. electrons and holes generated by the absorption of the radiation of the first wavelength. This local heating may be caused by the radiation having the second wavelength, which may deposit energy to the lattice in the separation layer via the electrons and holes, e.g. by absorption or another interaction with the electrons and holes.

For example, the electromagnetic radiation of the first wavelength may be emitted by a first radiation source and the electromagnetic radiation of the second wavelength may be emitted by a second radiation source different from the first radiation source. For example, the electromagnetic radiation of the first wavelength and the second wavelength may be concurrently irradiated onto the semiconductor substrate. For example, the electromagnetic radiation of the first wavelength and/or the second wavelength may be laser pulses. The laser pulses may be temporally coordinated to one another. For example, the laser pulses of the different wavelengths may overlap in the time domain or may not overlap due to a short time offset, for example.

For example, for electromagnetic radiation of the first wavelength, an absorption coefficient of the separation layer may be at least 100 times, or at least 1000 times, an absorption coefficient of a semiconductor material of the semiconductor substrate outside the separation layer.

For example, the second wavelength may be larger than the first wavelength. For example, the second wavelength may serve for depositing energy to the lattice of the separation layer via the free carriers, e.g. electrons and holes, in the separation layer, for example.

For example, the implanted ions may include nitrogen (N) ions, phosphorus (P) ions, vanadium (V) ions, boron (B) ions, argon (Ar) ions, carbon (C) ions, nickel (N) ions, silicon (Si) ions, titanium (Ti) ions, tantalum (Ta) ions, molybdenum (Mo), tungsten (W) ions, gallium (Ga) ions and/or aluminum (Al) ions. The implanted ions may integrate into the crystal lattice of the semiconductor substrate within the separation layer to form an absorption barrier for the light of the target wavelength. For example, nitrogen (N) ions, vanadium (V) ions, boron (B) ions, argon (Ar) ions, carbon (C) ions, nickel (Ni) ions, silicon (Si) ions and/or titanium (Ti) ions may form a strong absorption band (e.g., an absorption band having a strength greater than a threshold strength) after their integration into the semiconductor substrate. For example, aluminum ions, tantalum ions, boron ions, titanium ions and/or nickel ions may be implanted into the semiconductor substrate and the semiconductor substrate may be annealed (e.g., the semiconductor substrate may be annealed after implanting the ions). For example, ions (e.g., phosphor ions) may be implanted with an implantation dose of at least $2 \times 10^{15}$ cm$^{-2}$ (or at least $1 \times 10^{16}$ cm$^{-2}$ or at least $5 \times 10^{16}$ cm$^{-2}$). For example, nitrogen ions may be used, which may result in low damages at the implantation surface in comparison to other ions, for example. For the case that the implanted ions are donors or acceptors, the resulting locally enhanced charge carrier density can support the absorption process, for example in the case of the use of high implantation doses (e.g., implantation doses higher than a threshold implantation dose).

For example, the method may further comprise forming a semiconductor layer on the first surface of the semiconductor substrate. The semiconductor layer may be formed on the first layer after implanting the ions. The method may further comprise forming semiconductor device elements in the semiconductor layer. The semiconductor device elements may be formed in the semiconductor layer before separating the semiconductor substrate along the separation layer. Further details described in the examples above with respect to the semiconductor layer and the semiconductor device elements likewise apply.

For example, forming the semiconductor device elements in the semiconductor layer may include forming at least one doped semiconductor region in the semiconductor layer by introducing dopants into the semiconductor layer. The at least one doped semiconductor region is part of a power MOSFET, a diode, an IGBT, and/or a JFET (junction gate field-effect transistor). The at least one doped semiconductor region may be formed before separating the semiconductor substrate into the first substrate part and the second substrate part.

For example, separating the semiconductor substrate along the separation layer may comprise at least one of i) irradiating the semiconductor substrate with electromagnetic radiation; the electromagnetic radiation may be configured to be at least partly absorbed in the separation layer and/or may be configured to heat at least part of (e.g., the separation layer of) the semiconductor substrate, for instance by interaction with free charge carriers, i.e. electrons and holes, in the semiconductor device, ii) heating the semiconductor substrate, iii) applying mechanical force and/or stress to the semiconductor substrate, iv) ultrasonic treatment of the semiconductor substrate, or v) irradiating the semiconductor substrate with protons.

For example, applying mechanical force and/or stress to the semiconductor substrate may comprise forming a stress inducing layer on a second surface of the semiconductor substrate opposite to the first surface. Introduction of thermo-mechanical stress may be based on expansion coefficient differences of a semiconductor material of the semiconductor substrate and the stress inducing layer. One example is known as the so-called "Cold Split" process utilizing a polymer coating on the surfaces of the semiconductor substrate and a pre-cooling and cooling process for introducing the thermo-mechanical stress (e.g., the pre-cooling and cooling process may be performed after the polymer coating is formed). This causes a crack to expand from the local damage in the separation layer, and leads to the separation of the semiconductor substrate into the first substrate part and the second substrate part by splitting.

For example, the semiconductor substrate may be a SiC substrate, and a thickness of the separation layer may range from 300 nanometers (nm) to 600 nm, e.g. before the separation process and after implantation of the ions. In some other examples, the thickness of the separation layer may be even larger, e.g. up to some µm or even up to 50 µm.

For example, the separation layer may be formed within the semiconductor substrate at a vertical distance to the first surface of the semiconductor substrate that ranges from 500 nm to 70 µm or from 800 nm to 5 µm. For example, when using protons for the formation of the separation layer, the vertical distance may be larger compared with other ions, e.g. helium ions. For protons, the vertical distance may be around the upper limit of the above range, for example.

Details described in the example above likewise apply to the illustrated examples described below. For avoiding repetitions of details, e.g. materials, dimensions, functions of elements or processes described in the examples above, these details correspondingly apply to the illustrated examples described further below.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

It is to be understood that the disclosure of multiple acts, processes, operations, steps or functions disclosed in the specification or claims may not be construed as to be within the specific order, unless explicitly or implicitly stated otherwise, e.g. by expressions like "thereafter", for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

FIGS. 1A to 1D illustrate a method for processing a semiconductor substrate.

Referring to the schematic cross-sectional view of FIG. 1A, ions are implanted into a semiconductor substrate 100 through a first surface 102 of the semiconductor substrate 100. Ion implantation is schematically indicated in FIG. 1A by arrows 103 impinging on the first surface 102. The ions implanted into the semiconductor substrate 100 lead to cavities 104. The cavities 104 define a separation layer 106 in the semiconductor substrate 100. Details on ion implantation and cavities described in the examples above correspondingly apply.

Figure 1B:
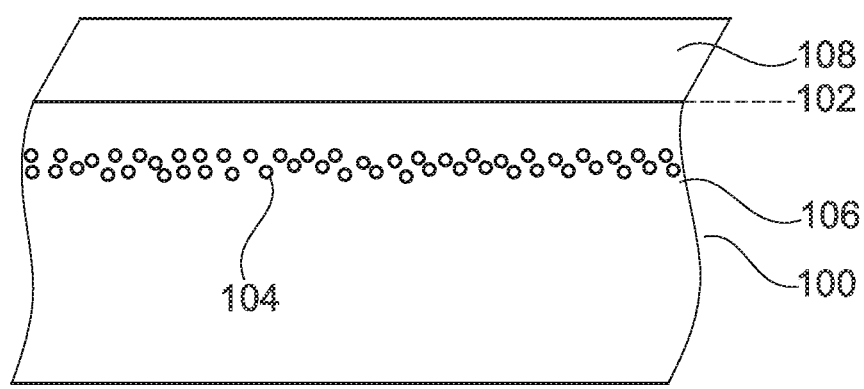

Referring to the schematic cross-sectional view of FIG. 1B, a semiconductor layer 108 is formed on the first surface 102 of the semiconductor substrate 100. Details on the semiconductor layer described in the examples above correspondingly apply.

Figure 1C:
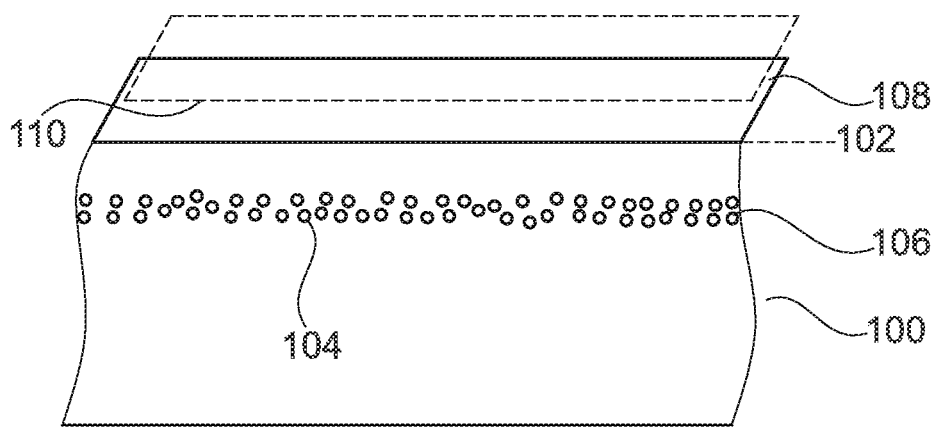

Referring to the schematic cross-sectional view of FIG. 1C, semiconductor device elements are formed in the semiconductor layer 108. In view of the various possibilities of semiconductor device elements formed in or over the semiconductor layer 108, the semiconductor device elements are illustrated in a simplified manner by a dashed box 110 indicating a part of semiconductor layer 108 or a wiring area above the semiconductor layer 108 that includes semiconductor device elements therein, for example. Details on the semiconductor device elements in the examples above correspondingly apply.

Figure 1D:
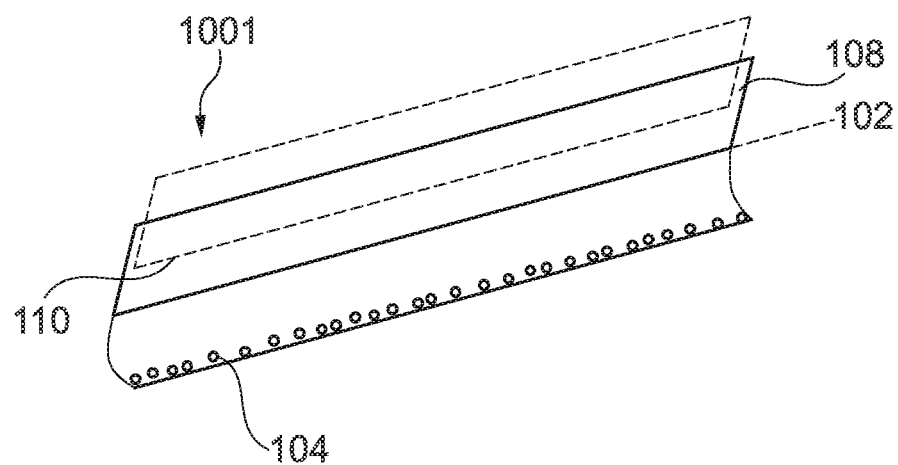
Figure 1D:
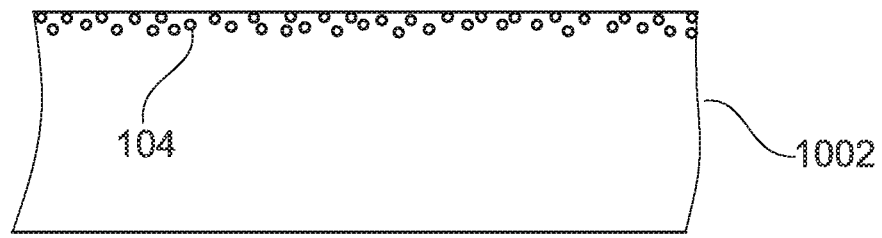

Referring to the schematic cross-sectional view of FIG. 1D, the semiconductor substrate 100 is separated along the separation layer 106 into a first substrate part 1001 including the semiconductor layer 108 and a second substrate part 1002. The first substrate part 1001 may be mechanically supported by a carrier attached to the first substrate part 1001 (e.g., the carrier may be attached to the first substrate part 1001 before separation), for example. Details on the separation process described in the examples above correspondingly apply.

Figure 2:
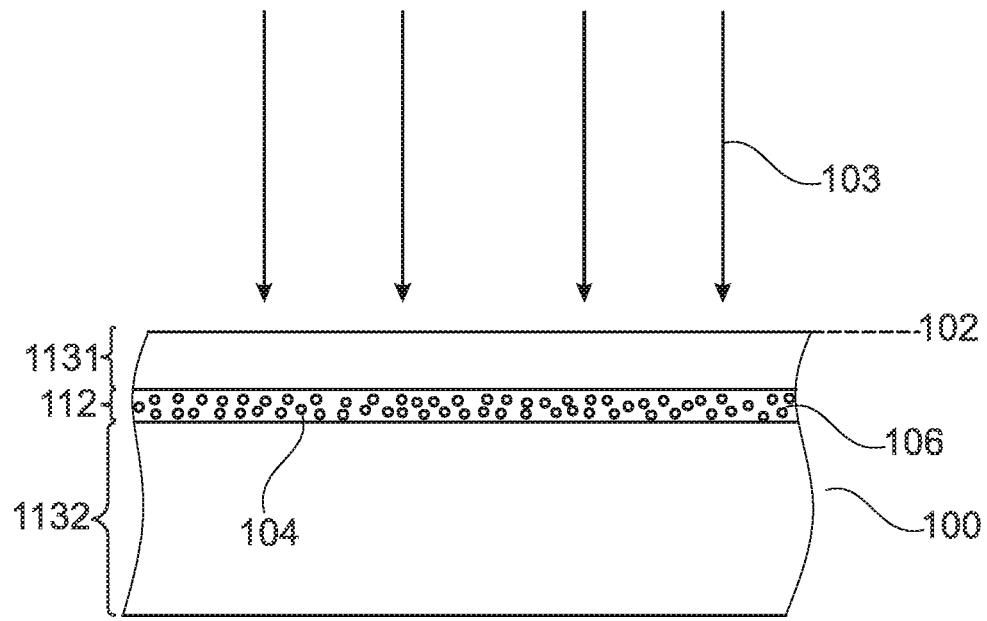
FIG. 2 is a schematic cross-sectional view for illustrating a process feature when processing a semiconductor substrate

In the schematic cross-sectional view illustrated in FIG. 2, the cavities 104 are formed in a porous part 112 of the semiconductor substrate 100. The porous part is arranged between non-porous, single crystalline parts 1131, 1132 of the semiconductor substrate 100. Details on the porous part 112 described in the examples above correspondingly apply.

Figure 3A:
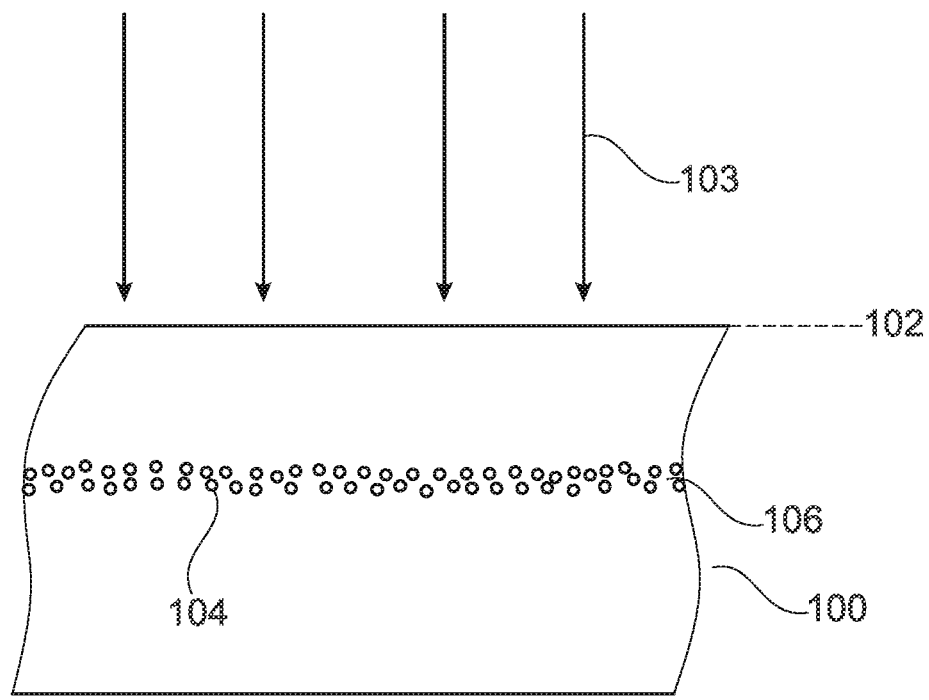
FIGS. 3A and 3B are schematic cross-sectional view for illustrating a method of processing a semiconductor substrate.
Figure 3B:
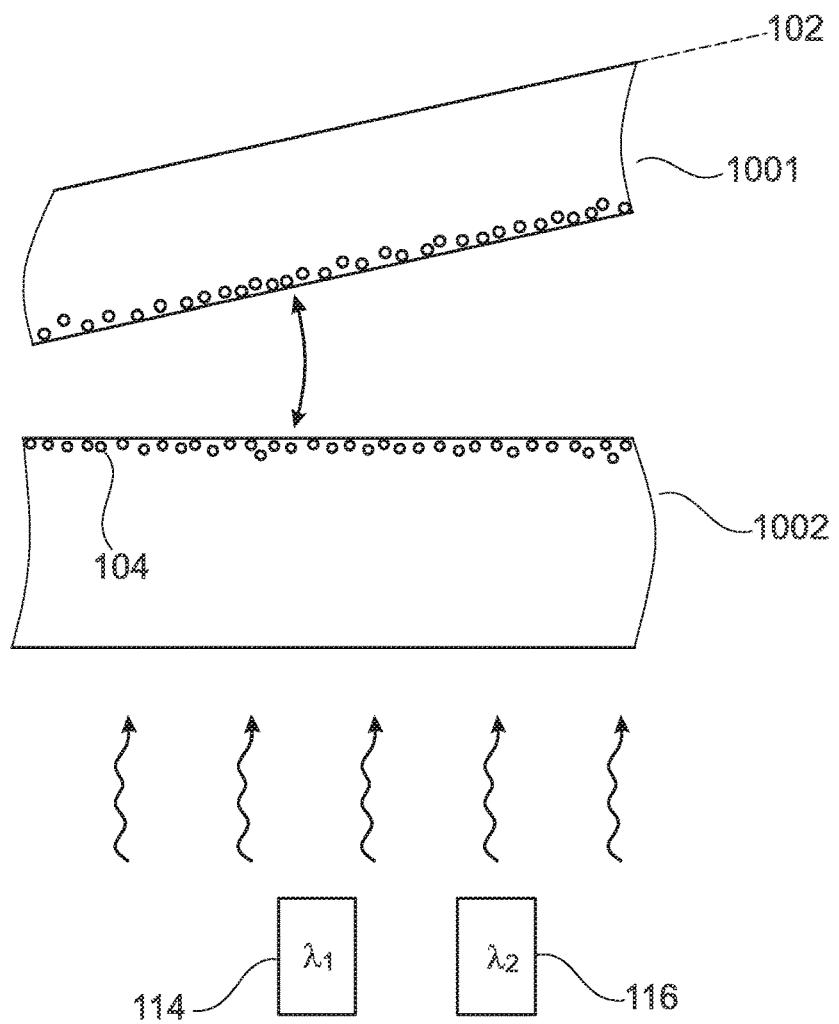

FIGS. 3A, 3B illustrates an example of a method for processing a semiconductor substrate.

Referring to the schematic cross-sectional view of FIG. 3A, ions are implanted through the first surface 102 of the semiconductor substrate 100 to define a separation layer 106 in the semiconductor substrate 100. For example, the implanted ions may include nitrogen ions, phosphorus ions, vanadium ions, boron ions, argon ions, carbon ions, nickel ions, silicon ions, titanium ions, tantalum, molybdenum, tungsten ions, gallium ions and/or aluminum ions.

Further processes may follow similar to the processes described with reference to FIGS. 1B, 1C.

Referring to the schematic cross-sectional view of FIG. 3B, the semiconductor substrate 100 is separated along the separation layer 106 into a first substrate part 1001 and a second substrate part 1002 at least by irradiating the semiconductor substrate 100 with electromagnetic radiation of a first wavelength $\lambda_1$ and with electromagnetic radiation of a second wavelength $\lambda_2$ different from the first wavelength $\lambda_1$. The electromagnetic radiation of the first wavelength $\lambda_1$ is emitted by a first radiation source 114 and the electromagnetic radiation of the second wavelength $\lambda_2$ is emitted by a second radiation source 116 different from the first radiation source 114. Details on the separation process based on the electromagnetic radiation of the first wavelength $\lambda_1$ and the second wavelength $\lambda_2$ described in the examples above correspondingly apply.

The examples of methods of processing the semiconductor substrate 100 may result in semiconductor devices as described with reference to FIGS. 4A to 4B below.

Figure 4A:
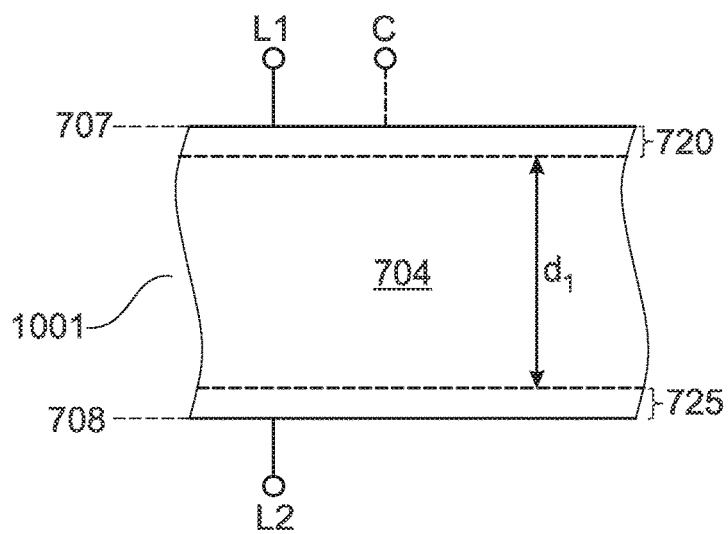
FIGS. 4A and 4B are schematic cross-sectional views for illustrating examples of semiconductor devices may be manufactured by the methods of FIGS. 1A to 3B.

FIG. 4A is a schematic cross-sectional view of a portion of a vertical semiconductor device according to an example. The vertical semiconductor device comprises the first substrate part 1001, for example a silicon semiconductor body or a silicon carbide semiconductor body. Precise adjustment of a thickness dl of a drift zone of the first substrate part 1001 includes process features described above with reference to FIGS. 1 to 3B.

The vertical semiconductor device includes a first load terminal structure 720 at a first surface 707, e.g. front surface of the first substrate part 1001. The first load terminal structure 720 includes doped semiconductor region(s). The doped semiconductor region(s) may be formed by doping processes of the semiconductor body 704 at the first surface 707, e.g. by diffusion and/or ion implantation processes as described with reference to formation of semiconductor device elements in FIG. 1C, for example. The doped semiconductor region(s) in the semiconductor body 704 of the first load terminal structure 720 may include doped source and body regions of a vertical power IGFET, for example a superjunction FET or of a collector of an IGBT, or of an anode or cathode region of a vertical power semiconductor diode or thyristor, for example. Depending on the power semiconductor device to be formed in the semiconductor body, a control terminal structure such as a planar gate structure and/or a trench gate structure including gate dielectric(s) and gate electrode(s) may be formed.

The vertical semiconductor device further includes a second load terminal structure 725 at a second surface 708, e.g. a rear surface of the semiconductor body 704 opposite to the first surface 707. The second load terminal structure 725 includes doped semiconductor region(s). The doped semiconductor region(s) may be formed by doping processes of the semiconductor body 704 at the second surface 708, e.g. by diffusion and/or ion implantation processes. The doped semiconductor region(s) in the semiconductor body 704 of the second load terminal structure 725 may include doped field stop region(s), doped drain regions of a vertical power FET, or an emitter of an IGBT, or an anode or cathode region of a vertical power semiconductor diode, for example. The implanted ions may be "activated", i.e. incorporated into the crystal lattice in region 725 by a thermal annealing act (e.g. melting or non-melting laser annealing from the back surface after implantation).

A first electrical load terminal contact L1 to the first load terminal structure 720 and an electrical control terminal contact C to a control terminal structure, if present in the vertical power semiconductor device, are part(s) of a wiring area above the first surface 707. A second electrical load contact L2 to the second load terminal structure 725 is provided at the second surface 708. The electrical load contacts L1, L2 and the electrical control terminal contact C may be formed of one or a plurality of patterned conductive layers such as metallization layers electrically isolated by interlevel dielectric layer(s) sandwiched between. Contact openings in the interlevel dielectric layer(s) may be filled with conductive material(s) to provide electrical contact between the one or the plurality of patterned conductive layers and/or active area(s) in the silicon semiconductor body such as the first load terminal structure 720, for example. The patterned conductive layer(s) and interlevel dielectric layer(s) may form the wiring area above the semiconductor body 704 at the first surface 707, for example. A conductive layer, e.g. a metallization layer or metallization layer stack may be provided at the second surface 708, for example.

In the vertical semiconductor device illustrated in FIG. 4A, a current flow direction is between the first and second load terminal contacts L1, L2 along a vertical direction between the opposite first and second surfaces 707, 708.

Figure 4B:
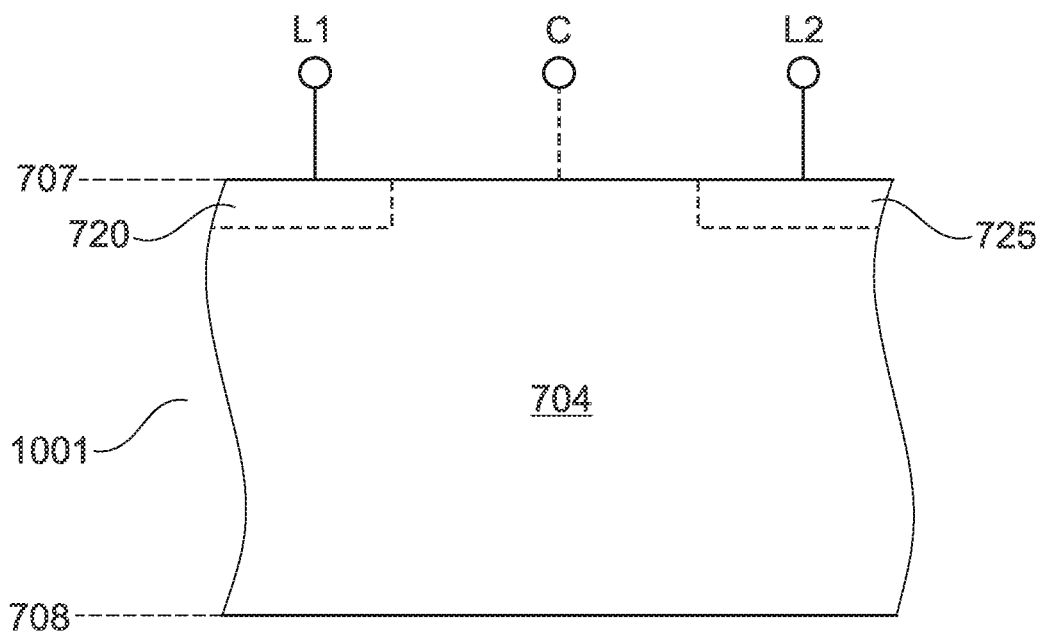

FIG. 4B is a schematic cross-sectional view of a portion of a lateral semiconductor device according to an embodiment. The lateral semiconductor device differs from the vertical semiconductor device in that the second load terminal structure 725 and the second load terminal contact L2 are formed at the first surface 707. The first and second load terminal structures 720, 725 may be formed simultaneously by same processes.

Likewise, the first and second load terminal contacts L1, L2 may be formed simultaneously by same processes.

The aspects and features mentioned and described together with one or more of the previously detailed examples and figures, may as well be combined with one or more of the other examples in order to replace a like feature of the other example or in order to additionally introduce the feature to the other example.

More details and aspects are mentioned in connection with the embodiments described above or below. Processing the wide band gap semiconductor wafer may comprise one or more optional additional features corresponding to one or more aspects mentioned in connection with the proposed concept or one or more embodiments described above or below.

What is claimed is:

1. A method for processing a semiconductor substrate, the method comprising:
    forming cavities in the semiconductor substrate by implanting ions through a first surface of the semiconductor substrate, wherein the cavities define a separation layer in the semiconductor substrate;
    after forming the cavities, forming a semiconductor layer on the first surface of the semiconductor substrate;
    forming semiconductor device elements in the semiconductor layer;
    after forming the semiconductor device elements in the semiconductor layer, separating the semiconductor substrate along the separation layer into a first substrate part comprising the semiconductor layer and a second substrate part; and
    implanting protons through the semiconductor layer into the semiconductor substrate.

2. The method of claim 1, wherein the ions comprise helium ions, and an implantation dose of the helium ions ranges from $5\times10^{14}$ centimeters $(cm)^{-2}$ to $5\times10^{15}$ $cm^{-2}$.

3. The method of claim 1, wherein the ions comprise protons, and an implantation dose of the protons ranges from $5\times10^{15}$ centimeters $(cm)^{-2}$ to $5\times10^{16}$ $cm^{-2}$.

4. The method of claim 1, wherein the ions comprise ions comprising carbon.

5. The method of claim 1, wherein a temperature of the semiconductor substrate during implantation of the ions is set in a range from 20° C. to 700° C.

6. The method of claim 1, wherein the cavities are formed in a porous part of the semiconductor substrate.

7. The method of claim 6, wherein the porous part is between non-porous, single crystalline parts of the semiconductor substrate.

8. The method of claim 7, comprising, before forming the cavities in the semiconductor substrate, processing the semiconductor substrate by forming a second semiconductor layer on a first portion of the semiconductor substrate, wherein the second semiconductor layer is a second portion of the semiconductor substrate exposed at the first surface of the semiconductor substrate, and wherein a thickness of the second portion of the semiconductor substrate ranges from 5 micrometers (μm) to 60 μm.

9. A method for processing a semiconductor substrate, the method comprising:
    implanting ions through a first surface of the semiconductor substrate to define a separation layer in the semiconductor substrate; and
    separating the semiconductor substrate along the separation layer into a first substrate part and a second substrate part,
    separating the semiconductor substrate along the separation layer comprises:
        irradiating the semiconductor substrate with electromagnetic radiation of a first wavelength emitted by a first radiation source and with electromagnetic radiation of a second wavelength emitted by a second radiation source different from the first radiation source.

10. The method of claim 9, wherein for the electromagnetic radiation of the first wavelength, an absorption coefficient of the separation layer is at least 100 times an absorption coefficient of a semiconductor material of the semiconductor substrate outside the separation layer.

11. The method of claim 9, wherein the second wavelength is larger than the first wavelength.

12. The method of claim 9, wherein the ions comprise at least one of nitrogen ions, phosphorus ions, vanadium ions, boron ions, argon ions, carbon ions, nickel ions, silicon ions, titanium ions, tantalum, molybdenum, tungsten ions, gallium ions or aluminum ions.

13. The method of claim 9, comprising:
forming a semiconductor layer on the first surface of the semiconductor substrate after implanting the ions; and
forming semiconductor device elements in the semiconductor layer before separating the semiconductor substrate along the separation layer.

14. The method of claim 13, wherein forming the semiconductor device elements in the semiconductor layer comprises forming at least one doped semiconductor region in the semiconductor layer by introducing dopants into the semiconductor layer, wherein the at least one doped semiconductor region is part of at least one of a power metal oxide semiconductor field effect transistor (MOSFET), a diode, an insulated gate bipolar transistors (IGBT), or a junction gate field-effect transistor (JFET).

15. The method of claim 9, wherein separating the semiconductor substrate along the separation layer comprises at least one of:
heating the semiconductor substrate;
ultrasonic treatment of the semiconductor substrate; or
irradiating the semiconductor substrate with protons.

16. The method of claim 9, wherein the semiconductor substrate is a SiC substrate, and a thickness of the separation layer ranges from 300 nanometers (nm) to 600 nm.

17. The method of claim 9, wherein the separation layer is within the semiconductor substrate at a vertical distance to the first surface of the semiconductor substrate that ranges from 500 nanometers (nm) to 5 micrometers ($\mu$m).

18. A method for processing a semiconductor substrate, the method comprising:
forming cavities in the semiconductor substrate by implanting ions through a first surface of the semiconductor substrate, wherein the cavities define a separation layer in the semiconductor substrate;
after forming the cavities, forming a semiconductor layer on the first surface of the semiconductor substrate;
forming semiconductor device elements in the semiconductor layer; and
after forming the semiconductor device elements in the semiconductor layer, separating the semiconductor substrate along the separation layer into a first substrate part comprising the semiconductor layer and a second substrate part,
separating the semiconductor substrate along the separation layer comprises concurrently irradiating the semiconductor substrate with superposed electromagnetic radiation from at least two radiation sources, the superposed electromagnetic radiation having intensity peaks at two or more wavelengths.

19. A method for processing a semiconductor substrate, the method comprising:
implanting ions through a first surface of the semiconductor substrate to define a separation layer in the semiconductor substrate; and
separating the semiconductor substrate along the separation layer into a first substrate part and a second substrate part,
separating the semiconductor substrate along the separation layer comprises applying at least one of mechanical force or stress to the semiconductor substrate, wherein applying at least one of the mechanical force or the stress to the semiconductor substrate comprises forming a stress inducing layer on a second surface of the semiconductor substrate opposite to the first surface.

* * * * *